(12) United States Patent
Wang

(10) Patent No.: US 6,460,044 B1
(45) Date of Patent: Oct. 1, 2002

(54) INTELLIGENT METHOD FOR COMPUTER FILE COMPRESSION

(76) Inventor: Jinbo Wang, Tuan Jie Hu Dong Li, Beijing (CN), 100026

( * ) Notice: Subject to any disclaimer, the term of this patent is extended or adjusted under 35 U.S.C. 154(b) by 0 days.

(21) Appl. No.: 09/241,472

(22) Filed: Feb. 2, 1999

(51) Int. Cl.[7] .............................................. G06F 17/30
(52) U.S. Cl. ...................................... 707/101; 707/100
(58) Field of Search ................................. 707/101, 100

(56) References Cited

U.S. PATENT DOCUMENTS

| | | | |
|---|---|---|---|
| 5,704,060 A | * 12/1997 | Del Monte | 707/104.1 |
| 5,751,590 A | * 5/1998 | Cannon et al. | 700/223 |
| 5,838,964 A | * 11/1998 | Gubser | 707/101 |
| 5,964,842 A | * 10/1999 | Packard | 709/247 |
| 6,014,671 A | * 1/2000 | Castelli et al. | 707/101 |
| 6,112,211 A | * 8/2000 | Bradshaw et al. | 707/205 |

OTHER PUBLICATIONS

Yang et al., On the Performance of data Compression Algorithms Based on String Matching, IEEE online, p. 47–65, Jan. 1998.*

Kotze et al, An Evaluation of the Lemple–Ziv–Welch Data Compression Algorithm, IEEE online, p. 65–69, Jun. 1989.*

* cited by examiner

*Primary Examiner*—Greta L Robinson
(74) *Attorney, Agent, or Firm*—Pennie & Edmonds LLP

(57) ABSTRACT

The present invention relates to an easy-to-use intelligent method for compressing computer files. In this method, a computer file containing different information types, such as text, image and sound, is automatically compressed by a computer, using suitable lossy or lossless codes. Both appropriate compression ratio and compression quality can be obtained. The present invention also relates to a method for decompressing a compressed file.

8 Claims, 2 Drawing Sheets

INTELLIGENT METHOD FOR COMPUTER FILE COMPRESSION

FIELD OF THE INVENTION

The present invention relates to a compression method and compression software for computer files. The present invention also relates to method and software for decompression of computer files that are compressed in accordance with the present invention.

BACKGROUND OF THE INVENTION

Original information, such as text, image and sound, is usually not compressed when it is stored in the form of computer files. Because the size of such non-compressed files can be large, however, it is often necessary to compress the files, before transmitting them electronically over a wide area network, such as the Internet, or storing them in a portable memory device, such as a floppy disk.

There are currently two existing methods for computer file compression. In the first method, an information type of the file is first recognized by a user who wishes to compress the file, and depending on the type of the file, the user then runs one or more specific types of computer file compression software to compress the file. For example, the user may run commercially available compression software ARJ for compression of text files, LeadView for compression of image files and RealAudio for compression of audio files. Although this method allows to obtain required compression ratio, this process may be time-consuming and may require many different types of compression software. It will be readily appreciated that this method of operation can be particularly inefficient when the file to be compressed contains multiple information types, such as text, image and audio, or when the user wishes to compress a large number of files, particularly if they do not all have the same information type.

The second compression method is to compress a file using only a lossless code, such as LZW, regardless of what type of information is contained in the file. This is manifest in the adoption of the V.42 bis chip in modems to compress all of the information that passes the modem, or in the use of Winzip software to compress files of different types. While this method can save time spent by the user, it has the inherent weakness that this compression mode is not necessarily well suited for the type of information that is being compressed. As a result, the compression ratios provided by such operation method are generally poor. This method of operation is more suitable for compression of character information, but not suitable for other types of information, such as for image or sound.

SUMMARY OF THE INVENTION

The object of the present invention is to provide an intelligent compression method for computer file compression. This object is achieved in the present invention, in which different types of information, such as test, image and sound, in a compute file is automatically compressed by a computer, using suitable lossy or lossless codes. The method of the present invention is easy-to-use and provides both an appropriate compression ratio and compression quality.

In one embodiment, the method of the present invention automatically compresses a computer file using a computer and it comprises the following steps: (1) operating to recognize a format of the file by an extension name of the file and in conjunction with control information of the file; and (2) compressing the file in accordance with the format of the file as follows: (a) if the format of the file is not recognized, compressing the file with a lossless code; (b) if the format of the file is recognized and the file includes only a single type of data information, compressing data information of the file with a suitable lossy or lossless code in accordance with the type of data information contained in the file; and (c) if the format of the file is recognized and the file includes a plurality of types of data information, first decompossing the file into a plurality of units each containing only a single type of data information, then compressing each unit with a suitable lossy or lossless code in accordance with the type of data information of the unit.

The method of the present invention may be used in any computer hardware and/or software system, such as in modem software or an e-mail system.

In accordance with another embodiment of the present invention, a method for automatically compressing a computer file using a computer is provided. The method comprises the following steps: (1) operating to recognize a format of the file by an extension name of the file and in conjunction with control information of the file; and (2) compressing the file in accordance with the format of the file as follows: (a) if the format of the file is recognized and the file contains only a single type of data information, compressing the data information contained in the file with a suitable lossy or lossless code in accordance with the type of data information contained in the file; (b) if the file format is not recognized or the file contains more than one type of data information type, compressing the file directly with lossless code.

BRIEF DESCRIPTION OF THE DRAWINGS

The present invention can be realized by computer software, computer hardware or a combination of computer hardware and software. This invention will be more apparent from the following description in conjunction with the appended drawings, in which.

DETAILED DESCRIPTION OF THE INVENTION

The intelligent method for compressing computer files will now be described with ference to the figures, which illustrate, in a flowchart form, a preferred embodiment of the esent invention.

Figure 1:
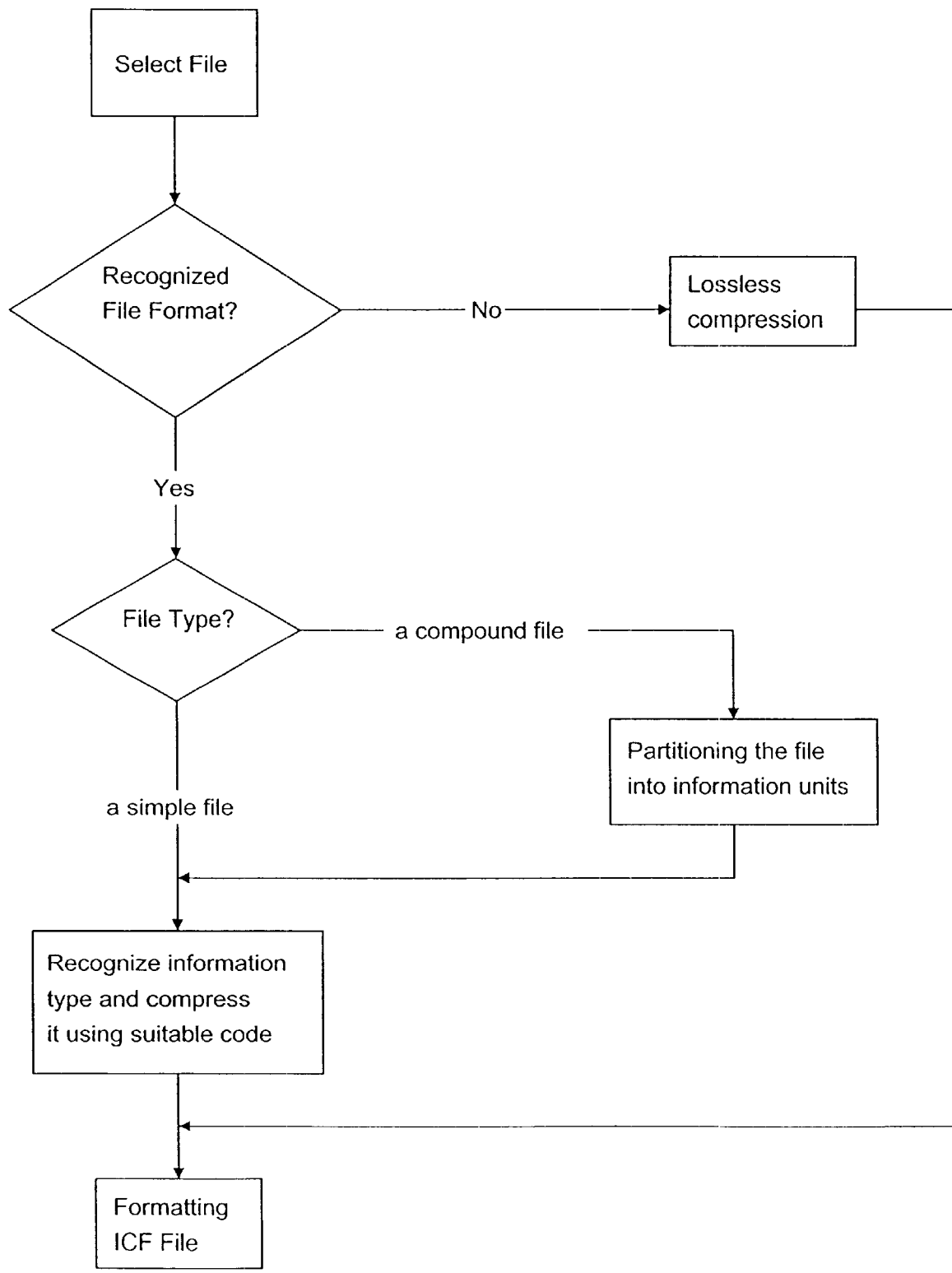
FIG. 1 illustrates, in a flow chart form, a method for compressing a computer file of the present invention.

FIG. 1 depicts, in a flow chart form, a method of compressing a computer file of the present invention. The first action in accordance with FIG. 1 is selecting a computer file which is to be compressed. This file selection is carried by the user who wish to compress a particular file. All of the other steps illustrated in FIG. 1, except file selection, are automatically carried out by a computer system in accordance with the present invention. These steps are as follows:

A. The computer system operates to recognize the format of the file by the extension name of the file and in conjunction with the control information of the file to determine whether or not the file format is known.

B. If the file format is not known, then the system will automatically compress he file with a lossless code, such as LZW.

C. If the file format is known, the system then determine whether the file is a simple file (i.e., it contains only a single data information type, such as text, Bitmap or Wave), or the file is a compound file (i.e., it contains more than one type of data information).

D. If the file is a simple file, the system will then automatically recognize the type of data information contained in the file and automatically compress the data information using a suitable code. For example, a lossless code, such as LZW, may be used for compression of character information. A proper lossy code, such as JPEG or G.723, may be used for compression of image or audio information.

E. If the file is a compound file, such as RTF or HTML, and the system will automatically decompose the file into a plurality of units each containing only a single data information type, and then compressing each unit just as in the former case.

In accordance with the present invention, In order to decrease the complexity of the system, the system may also compress the compound file directly with a lossless code without the decomposition step and the followed steps. For reason of simplicity, this option is not depicted in FIG. 1.

F. Although it is currently the case that the compressed image information has a standard file format, such as JPEG, but the other information compressed by codes such as LZW or G.723, do not have a standard file format. In order to contain the compressed data and control information, the compressed file format must be defined, which is defined herein as ICF ("Intelligent Compression Format"), with an extension name of icf. In the final step of FIG. 1, a compressed file is formatted according to the ICF format.

Figure 2:
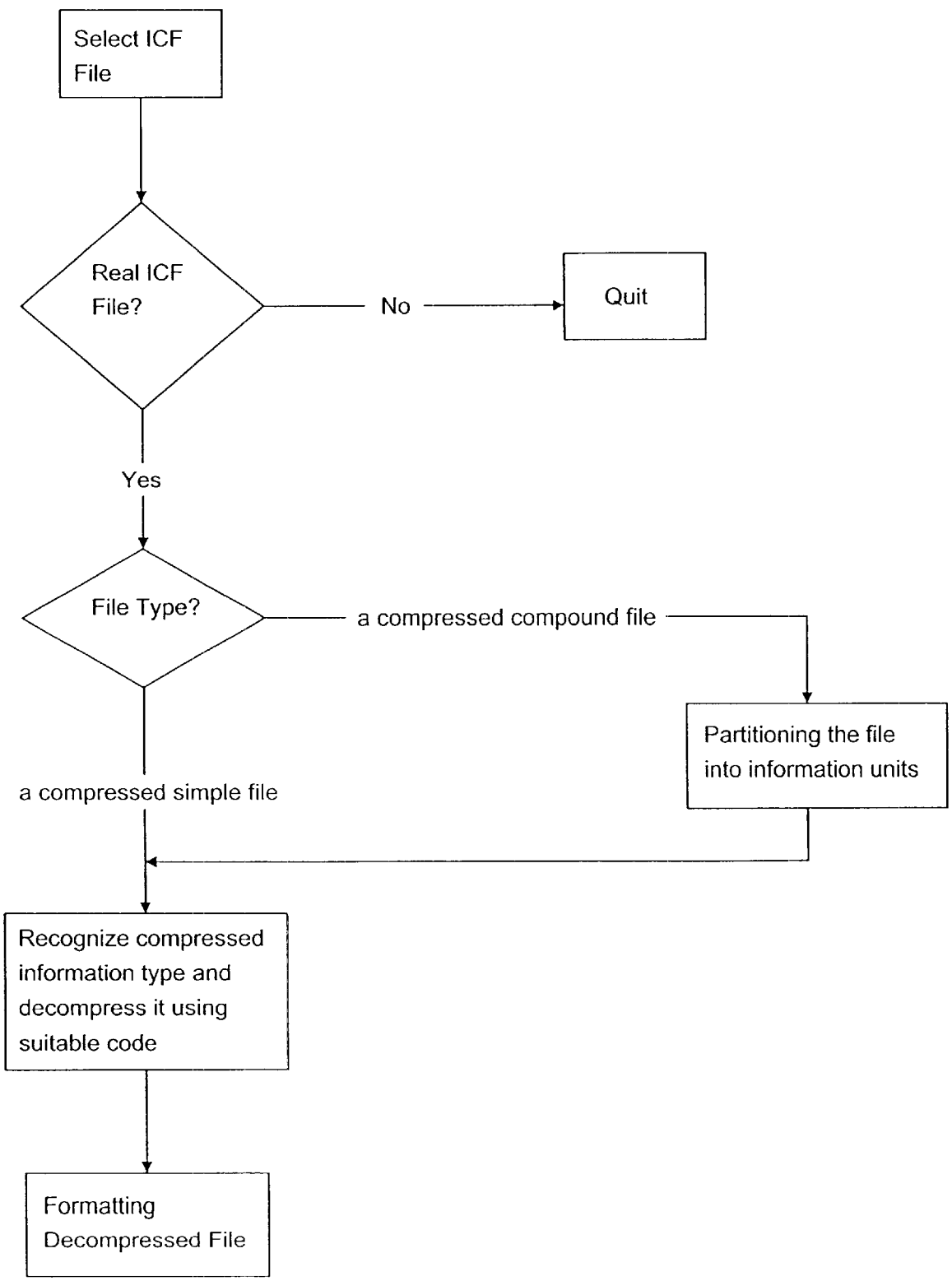
FIG. 2 depicts, in a flow chart form, a method for decompressing a computer file of the present invention that has previously been compressed with the method of this invention.

It is important that it be possible to decompress a file that has been compressed according to the compression method of the present invention described above. A preferred embodiment of the decompression method is described with reference to FIG. 2. The first step in FIG. 2 is the ICF file selection, that means a user should select a file which must have an icf extension. In accordance with the present invention, the selected icf file is then subjected to the verification step, in which the control information of the file is automatically checked by a computer system to ascertain whether or not the format of the file is truly in the ICF format. All the followed actions are also automatically carried out by the computer system.

If the file is not a proper ICF file, then a termination step is executed. During execution of this step, the user is notified that the file is not in the proper format, and the method ceases.

If the file is determined to be in the ICF format by the verification step, the system will then further determine whether or not the file is a compressed simple file that contains only one type of compressed data information, or the file is a compressed compound file that contains more than one type of compressed data information.

If the ICF file is a compressed simple file, the system will automatically recognize the type of data information of the file, and decompressing the data information using corresponding suitable decode.

If the ICF file is a compressed compound file, such as the ICF file formed by compressing an RTF or HTML file, the system will automatically decomposes the ICF file into a plurality of compressed data information units each containing only a single type of compressed data information, and then decompressing each such unit just as in the above event.

If, in the compression stage, the compound file was compressed directly with a lossless code, in this decompression steps, the file will be decompressed using the corresponding a lossless decode. For reason of simplicity, this step is not illustrated in the FIG. 2.

The final action in FIG. 2 is to form a decompressed file and reconstruct its original file format.

It will be apparent to one skilled in the art that the method of the present invention can be readily adopted into various application systems, such as modem software and E-mail systems, to improve the speed of file transmission.

In accordance with the present invention, a new type of compression and decompression software has been provided. This software provides a simple-to-use and efficient way for computer file compression and decompression, with both an appropriate compression ratio and compression quality. This software has demonstrated that the method of the present invention as described herein is advantageous over existing file compression methods.

Although the present invention has been described with reference to a preferred embodiment, it will also be appreciated by those of ordinary skill in the art that modifications can be made to the form of the invention without departing from its spirit and scope, which is defined in the following claims.

What is claimed is:

1. A method for automatically compressing different types of computer files by a computer, comprising:
   (1) identifying file format of a selected file by extension name and control information of the file as follows:
      a. determining specific file types that have known file formats and can not be effectively compressed only with a lossless encode;
      b. forming the specific file types from a list of file extension names of these file types and from a list of file control information corresponding to each file extension name of these file types; and
      c. checking whether the selected file's extension name is on the list of file extension names; if the response is positive, checking whether the selected file is as indicated by the file control information from the list of file control information corresponding to the extension name of the selected file;
      wherein if both the above checks are positive, then the format of the selected file is recognized; if either one of the above two checks is negative, then the format of the selected file is not recognized; and
   (2) compressing the selected file In accordance with Its identified file format as follows:
      a. if the format of the selected file is not recognized, compressing the file with a lossless encode;
      b. if the format of the selected file is recognized and the file includes only a single type of data information, compressing data information of the file with a suitable lossy or lossless encode in accordance with the type of data information contained in the file; and
      c. if the format of the selected file is recognized and the file includes a plurality of types of data information, first partitioning the file into a plurality of data information units each containing only a single type of data informaton, and then compressing each unit with a suitable lossy or lossless encode in accordance with the type of the data information contained in the unit.

2. A method for automatically compressing different types of computer files by a computer, comprising the following steps:

(1) identifying file format of a selected file by extension name and control information of the file as follows:
 a. determining specific file types that have known file formats and can not be effectively compressed only with a lossless encode;
 b. forming the specific file types from a list of file extension names of these file types and from a list of file control information corresponding to each file extension name of these file types; and
 c. checking whether the selected file's extension name is on the list of file extension names; if the response is positive, checking whether the selected file is as indicated by the file control information from the list of file control information corresponding to the extension name of the selected file;
 wherein if both the above checks are positive, then the format of the selected file is recognized; if either one of the above two checks is negative, then the format of the selected file is not recognized; and
(2) compressing the selected file in accordance with its identified file format as follows;
 a. if the format of the selected file is recognized and the file contains only single type of data information, compressing the data information contained in the file with a suitable lossy or lossless encode in accordance with the type of data information contained in the file; and
 b. if the format of the selected file is not recognized or the file contains more than one type of data information, compressing the file directly with a lossless encode.

3. The use of the method of claim 1 in computer software, computer hardware, or a combination of computer hardware and software.

4. The use of the method of claim 2 in computer software, computer hardware, or a combination of computer hardware and software.

5. The use of the method of claim 1 as a separate compression tool.

6. The use of the method of claim 1 as a separate compression tool.

7. The use of the method of claim 1 in any application system.

8. The use of the method of claim 1 in any application system.

* * * * *

UNITED STATES PATENT AND TRADEMARK OFFICE
CERTIFICATE OF CORRECTION

PATENT NO. : 6,460,044 B1
DATED : October 1, 2002
INVENTOR(S) : Jinbo Wang

It is certified that error appears in the above-identified patent and that said Letters Patent is hereby corrected as shown below:

<u>Column 1,</u>
Line 57, change "test" to -- text --.

<u>Column 2,</u>
Line 8, change "decompossing" to -- partitioning --;
Line 60, delete "These steps are as follows:"
Line 61, before "A. The Computer.....", insert a new paragraph as follows:
-- The present invention provides a method for automatically compressing different types of computer files by a computer. In the computer system in accordance with the present invention, specific file types are determined that have known file formats and can not be effectively compressed only with a lossless encode. The specific file types are formed from a list of file extension names of these file types and from a list of file control information corresponding to each file extension name of these file types. --
Line 61, change "recognize" to -- identify --.
Line 65, before "B. If the file format.....", insert a new paragraph as follows:
   -- In one embodiment, the computer system can operate to check whether the selected file's extension name is on the list of file extension names. If the response is positive, the computer system can check whether the selected file is as indicated by the file control information from the list of file control information corresponding to the extension name of the selected file. If both the above checks are positive, then the format of the selected file is recognized. If either one of the above two checks is negative, then the format of the selected file is not recognized. --

UNITED STATES PATENT AND TRADEMARK OFFICE
CERTIFICATE OF CORRECTION

PATENT NO.   : 6,460,044 B1
DATED        : October 1, 2002
INVENTOR(S)  : Jinbo Wang It is certified that error appears in the above-identified patent and that said Letters Patent is hereby corrected as shown below:

Column 3,
Line 14, change "decompose" to -- partition --.

Column 6,
Line 17, change "claim 1" to -- claim 2 --;
Line 21, change "claim 1" to -- claim 2 --.

Signed and Sealed this

First Day of April, 2003

JAMES E. ROGAN
*Director of the United States Patent and Trademark Office*